United States Patent [19]

Kiblaire et al.

[11] 4,367,372

[45] Jan. 4, 1983

[54] FLAT MULTI-STRAND SUPERCONDUCTING CONDUCTOR WITH A SEPARATOR

[75] Inventors: Michel Kiblaire; Henri Nithart, both of Belfort; Alain Fevrier, Maurepas; Jacques Maldy, Saint Cheron, all of France

[73] Assignees: Alsthom-Atlantique; Electricite de France Service National, both of Paris, France

[21] Appl. No.: 251,444

[22] Filed: Apr. 6, 1981

[30] Foreign Application Priority Data

Apr. 4, 1980 [FR] France ................................ 80 07682

[51] Int. Cl.³ ............................................. H01B 5/08
[52] U.S. Cl. ............................... 174/128 S; 174/15 S; 174/34; 174/126 S; 174/129 R; 335/216
[58] Field of Search ..................... 174/15 S, 15 C, 34, 174/126 R, 126 S, 128 S, 129 R; 335/216; 29/559

[56] References Cited

U.S. PATENT DOCUMENTS

| | | | |
|---|---|---|---|
| 3,638,154 | 1/1972 | Sampson et al. | 335/216 |
| 3,699,647 | 10/1972 | Bidault et al. | 174/128 S X |
| 3,737,824 | 6/1973 | Coles | 174/126 S X |
| 3,742,116 | 6/1973 | Aupoix et al. | 174/34 |
| 3,997,714 | 12/1976 | Letellier et al. | 174/34 |

Primary Examiner—Volodymyr Y. Mayewsky
Attorney, Agent, or Firm—Sughrue, Mion, Zinn, Macpeak & Seas

[57] ABSTRACT

A flat multi-strand superconducting conductor with a separator.

The conductor is constituted by transposed strands which form two layers (12, 14) on either side of an insulating separator (2, 3, 4) which is formed around a core (3, 4) including a continuous metal detector line so as to allow the transitions of the superconducting strands to be detected by measuring the voltage at the terminals of the conductor and compensating the induced voltage detected at the terminals of this detector line.

Application to cryoalternators.

5 Claims, 2 Drawing Figures

FLAT MULTI-STRAND SUPERCONDUCTING CONDUCTOR WITH A SEPARATOR

BACKGROUND OF THE INVENTION

The multi-strand superconducting conductors used in windings or in alternators of the cryoalternator type are often made in the form of a flat tapes over whose surfaces the superconductor strands are twisted for transposition purposes, so that the strands constantly form two layers one on each side of the tape, each strand passing alternately from one layer to the other round the edges of the tape. When high voltages are induced by variable magnetic fields, the short circuits which are then the most likely to occur are those between the layers at the points where the strands pass from one to the other.

The first necessity which then appears is to dispose a separator in the form of a tape between the two layers, with at least the surface of the tape acting as an insulator. Indeed, it is known that such a separator alone is sufficient to provide practical protection against short-circuits between the layers.

The second necessity which appears in numerous cases is to detect rapidly transistions in which a strand changes locally from the superconducting state to the normal state, so as to then switch to prevent such transition from extending along the conductor and leading finally to the destruction thereof by overheating. Such transitions are detected by the voltage of resistive origin which they set up across terminals of the conductor. However, this resistive voltage can be masked by much higher voltages which are induced along the length of the conductor by the variable magnetic fields. Therefore, to detect the resistive voltage, it is necessary to remove the effect of the induced voltage. In the case of a winding, it is known that this can be done by providing thereon a centre tap and putting the total voltages which appear in the two halves of the winding in opposition so that the induced voltages compensate each other while the resistive voltage which results from an accidental local transition normally appears only across the terminals of one of the halves of the winding only and can therefore be detected. This solution is not applicable to the windings of an alternator.

Another known solution consists in adding a "detector" superconductor line along the entire length of the "main" superconductor line. The detector line is in contact with the main line via an insulating layer. The same voltages are induced in the detector (which is left open circuit) as in the main line. Thus to detect the resistive voltage it is then only necessary to compare the voltages in the two conductors. This solution has the drawback of complicating the construction of the conductor.

Preferred embodiments of the present invention provide a flat multi-strand superconductor having a separator, its construction is simple and it facilitates detection of any transitions, even when used in the windings of an alternator.

SUMMARY OF THE INVENTION

The present invention provides a flat multi-strand superconducting conductor with a separator, said conductor including:

an insulating separator in the form of a tape with its length along an axis OX, its width along an axis OY and its thickness along an axis OZ;

superconductor strands inclined relative to the axis OX and surrounding the separator so as to constitute a multi-strand conducting assembly which in the aggregate leads the current along the axis OX in two layers disposed on both surfaces of the separator and separated thereby, the total voltage at the terminals of this assembly being the sum of the voltage induced by the variable magnetic fields and of the resistive voltage which results from possible transitions of strands from the superconducting state to the normal state; and a detector line which extends along the whole conductor, thus collecting between its terminals the same said induced voltage, so as to allow said transitions to be detected by subtracting this induced voltage from the said total voltage;

wherein this detector line is constituted by a core which is at least partially made of metal and surrounded by an insulating layer, which core, with this insulating layer, constitutes said separator;

and wherein the metal components of this core are disposed so as to make the core easily deformable by bending not only in the plane OX, OZ, but also in the plane OX, OY, to avoid disintegration of the conductor when it is curved in several planes.

Preferably said core is inclined in one direction and in the other relative to the axis OX so that the length of any travel along a succession of these components is at least 10% longer than that of the conductor and so as thus to facilitate bending of the conductor.

BRIEF DESCRIPTION OF THE DRAWINGS

Two embodiments of the invention are described by way of non-limiting example with reference to the accompanying drawings in which.

DESCRIPTION OF PREFERRED EMBODIMENTS

Figure 1:
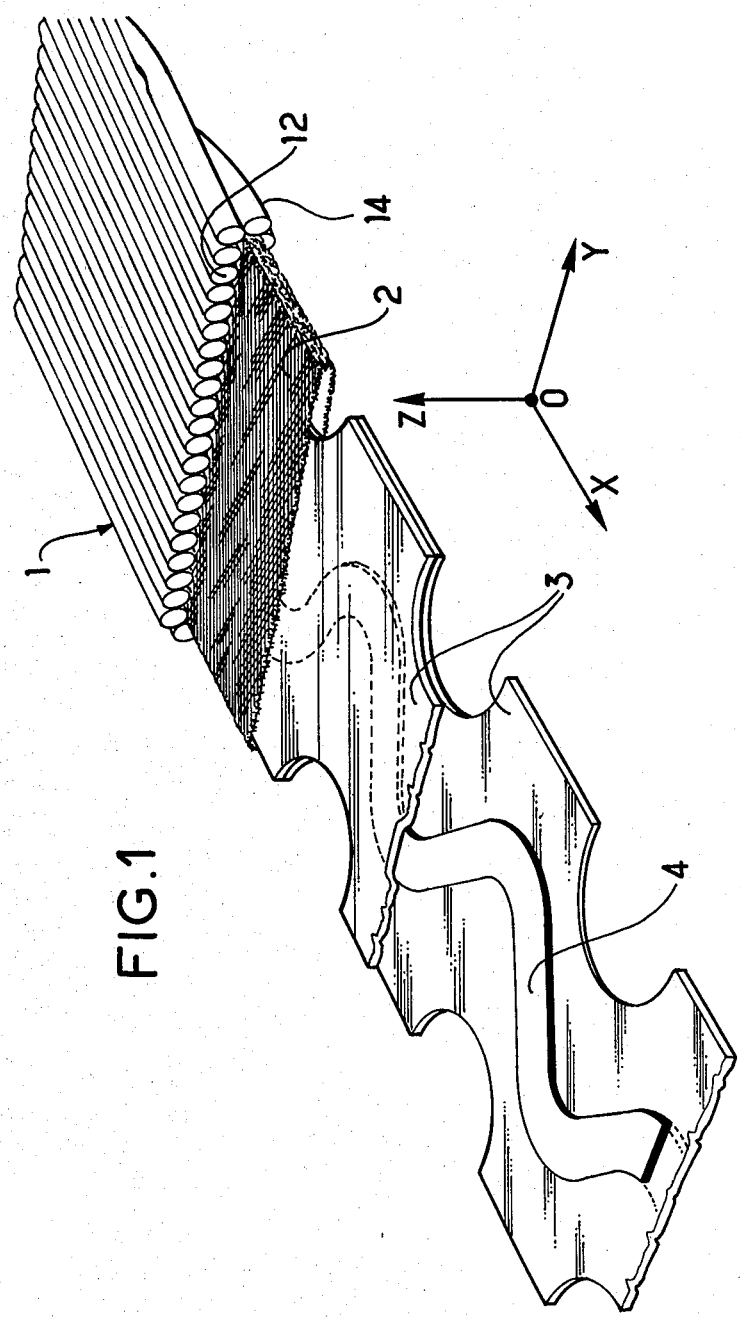
FIGS. 1 and 2 are partially cut away perspective views of first and second conductors embodying the invention.

FIG. 1 illustrates superconducting strands 1. There are, for example, 23 strands each having a diameter of 0.7 mm and forming two layers of contiguous strands, each strand passing alternately from an upper layer 12 to a lower layer 14, crossing over the entire width of the layer each time so as to form a transposition of known type.

The two layers are separated by a separator constituted by a flattened tubular insulating braid 2, 7 mm wide and 0.4 mm thick in the pressed state. This braid 2 can be constituted by aromatic polyamide fibres, for example those sold by Messrs. Dupont de Nemours under the commercial name Nomex.

Two layers 3 of polyimide sold by Messrs. Dupont de Nemours under the commercial name Kapton are disposed across the whole width of this braiding. These layers constitute an excellent electric insulator. They are each 25 microns thick, for example.

A corrugated or sinuous copper tape 4, which is 0.05 to 0.1 mm thick and about 1 mm wide is disposed between these two layers. This corrugated tape constitutes the at least partially metal core which performs the function of a detector line. The corrugations increase the flexibility of this core in the plane XO, OY. They may have a pitch of 5 mm and an amplitude of 1 mm, for example. To further increase the flexibility of the core, there are cuts in the edges of the two insulating tapes 3 to form notches opposite the concavities of the corrugations of the tape 4.

Figure 2:
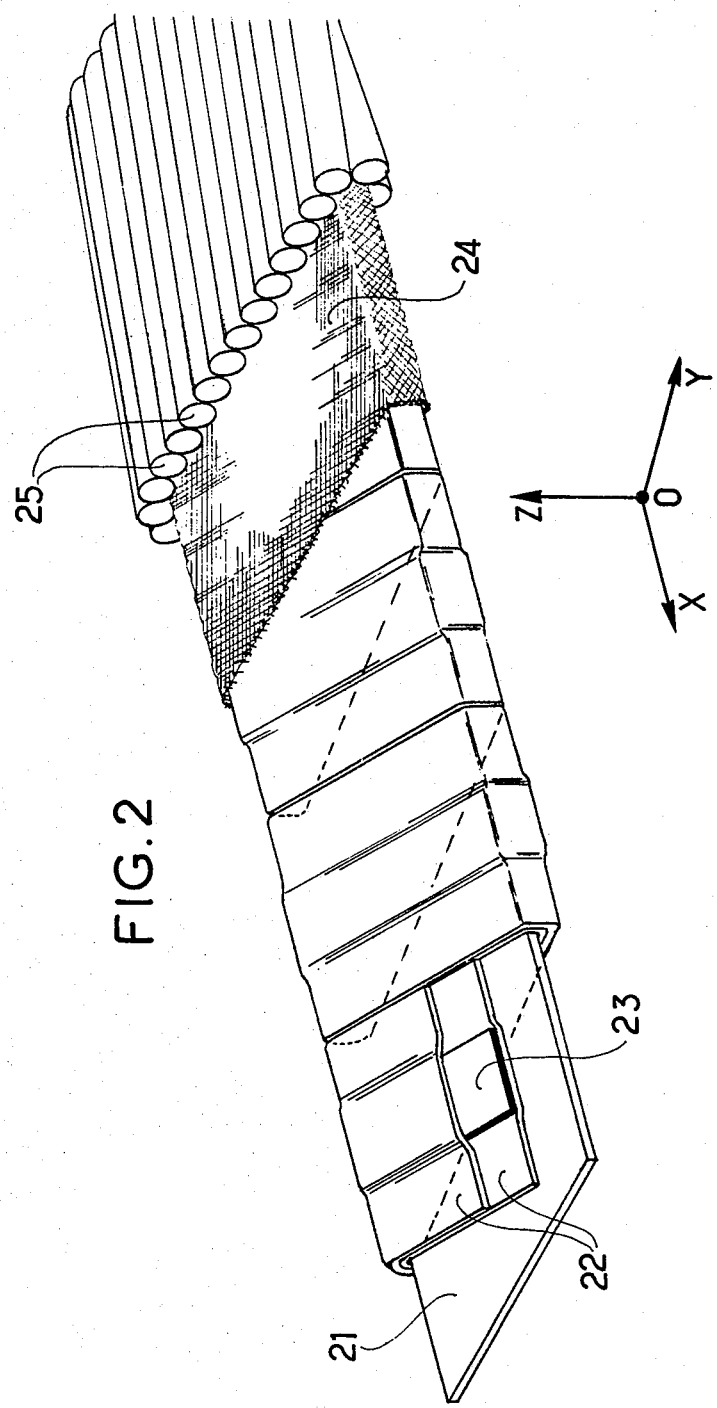

In the conductor of FIG. 2, superconducting strands 25 are disposed like the strands 1 in FIG. 1. However, the separator in the form of a tape is constituted by a flattened roll of metal tape 23 which constitutes said detector line and is coated with insulating layers 22 and insulating braid 24. The length and width of this metal tape are disposed in the plane OX, OY and its thickness is disposed along the axis OZ. It is disposed obliquely relative to the axis OX and is bent at both the edges of the separator, with the fold lines parallel to OX so as to be disposed alternately on one surface of this separator then on the other with symmetrical inclinations relative to this axis.

The insulating assembly is itself made of two components: the metal tape 23 is firstly placed between two polyimide insulating tapes 22 which are wider than it and are glued to each other by both their edges on either side of the tape 23 so as to form a first insulating covering 22 all around this tape. The wider tape assembly thus obtained is wound in a flat helix with contiguous turns around an insulating mandrel 21 which is itself in the form of a tape and the whole is placed in a second insulating covering 24 constituted by braiding analogous to the braid 2.

Many other embodiments of the separator in accordance with the invention are, of course, possible. For example, the separator can be constituted by a flat braiding of insulating fibres with one or more metal wires which constitute the detector line, an insulating covering in the form of braiding or of a continuous layer preventing contact between these metal wires and the superconducting strands. It can also be formed around a metal tape which extends in the direction OX without any corrugations or bends but with slots which extend alternately from both its edges in the direction OY to give it sufficient flexibility in the plane YOY.

We claim:

1. A flat multi-strand, superconducting conductor, said conductor including:
    an insulating separator in the form of a tape with its length along an axis OX, its width along an axis OY and its thickness along an axis OZ;
    superconductor strands inclined relative to the axis OX and surrounding the separator so as to constitute a multi-strand conducting assembly which in the aggregate leads the current along the axis OX in two layers disposed on opposite side surfaces of the separator and separated by said insulating separator, the total voltage at the terminals of this assembly being the sum of the voltage induced by the variable magnetic fields and of the resistive voltage which results from possible transitions of strands from the superconducting state to the normal state; and
    a detector line which extends along the whole conductor, thus collecting between its terminals the same said induced voltage, so as to allow said transistions to be detected by subtracting this induced voltage from said total voltage;
    wherein said detector line is constituted by a core which is at least partially made of metal and surrounded by an insulating layer, which core, with said insulating layer, constitutes said separator;
    and wherein the metal components of said core is disposed so as to make said core easily deformable by bending in the plane OX, OZ, and in the plane OX, OY, to avoid disintegration of the conductor when it is curved in several planes.

2. A conductor according to claim 1, wherein the metal components of said core are inclined in one direction and in the other relative to the axis OX so that the length of any travel along a succession of these components is at least 10% longer than that of the conductor and so as thus to facilitate bending of the conductor in its plane (OX, OY).

3. A conductor according to claim 2, wherein:
    said core is a metal core and is in the form of a corrugated tape whose corrugations lie in the plane OX OY and maintain said tape in said plane as far as concerns both its length and its width, the thickness of said tape being disposed along the axis OZ; and
    said corrugated tape being disposed between two insulating tapes superposed along the axis OZ, the length, the width and the thickness of said two insulating tapes being disposed along the axes OX, OY and OZ respectively, with the sides of said two insulating tapes extending beyond the sides of said corrugated tape.

4. A conductor according to claim 3, wherein notches are cut in the side edges of the two insulating tapes, said notches being adjacent to concave portions of the corrugations in the corrugated tape.

5. A conductor according to claim 2, wherein said separator is in the form of a tape and said conductor is constituted by a flat winding of metal tape which consitutes said detector line and is covered with an insulating layer, the length and the width of said metal tape being disposed in the plane OX, OY and its thickness being disposed along the plane OZ, and being folded over the two edges of said tape form separator, the lines of the folds being parallel to OX so as to be disposed alternately on opposed surfaces of said separator with inclinations which are symmetrical relative to this axis.

* * * * *